(12) United States Patent
Hasegawa et al.

(10) Patent No.: US 6,710,669 B2
(45) Date of Patent: Mar. 23, 2004

(54) VOLTAGE CONTROLLED OSCILLATOR

(75) Inventors: Eiichi Hasegawa, Tokyo (JP); Kazuhisa Oyama, Tokyo (JP)

(73) Assignee: Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 10/134,897

(22) Filed: Apr. 29, 2002

(65) Prior Publication Data

US 2002/0171500 A1 Nov. 21, 2002

(30) Foreign Application Priority Data

May 18, 2001 (JP) ........................................ 2001-148895

(51) Int. Cl.[7] ................................................ H03B 1/00
(52) U.S. Cl. .................................. 331/177 V; 331/36 C
(58) Field of Search ........................... 331/177 V, 36 C, 331/116 R, 116 FE, 158, 173, 179

(56) References Cited

U.S. PATENT DOCUMENTS 5,030,926 A * 7/1991 Walden ................. 331/116 FE
6,040,744 A * 3/2000 Sakurai et al. ............... 331/176
2002/0024397 A1 * 2/2002 Fujii et al. ............... 331/116 R

* cited by examiner

*Primary Examiner*—Henry Choe
(74) *Attorney, Agent, or Firm*—Jordan and Hamburg LLP (57) ABSTRACT

To provide a voltage controlled oscillator having a large variable width of oscillation frequency while ensuring oscillation starting performance, a P-channel MOS transistor Tr is made ON by detecting that an oscillation signal is provided with a predetermined amplitude value and oscillating operation is shifted from an initial state to a steady state by a detecting circuit OPC and a capacitor CA is connected in series with a series circuit constituted by a crystal resonator XL and a varicap diode CV. In the initial state, a load capacitance is reduced to thereby cancel an amount of reducing conductance gm of an oscillation amplifying portion to correspond to operation of the crystal resonator by a low amplitude and negative resistance necessary for maintaining excellent oscillation starting performance is provided and in the steady state, a width of changing the oscillation frequency is enlarged by enhancing an effect of the varicap diode CV.

10 Claims, 7 Drawing Sheets

PRIOR ART

Fig. 9

PRIOR ART

VOLTAGE CONTROLLED OSCILLATOR

BACKGROUND OF THE INVENTION

1. Field of the Invention

The present invention relates to a voltage control type oscillating circuit.

2. Description of the Related Art

At present, as a voltage controlled oscillator, there is a constitution used by externally attaching a piezoelectric resonator such as a crystal resonator and a variable capacitance diode or so-to-speak varicap diode to an oscillation amplifying portion integrated into a single chip. As such a voltage controlled oscillator, there are constitutions shown by, for example, FIG. 8 and FIG. 9. According to a constitution shown in FIG. 8, a feedback resistor rf is connected between an input terminal in and an output terminal out of a CMOS inverter iv1 and a capacitor cg constituting a load capacitance is connected between the input terminal in and a power source terminal VDD (for example, 3V). A connection point of the input terminal in and the capacitor cg is connected with a terminal xin for externally attaching one terminal of a crystal resonator x1 constituting a piezoelectric resonator. A connection point of the output terminal out and the resistor rf is connected with one terminal of a resistor rd for restricting current flowing in the crystal resonator x1, other terminal of the resistor rd is connected with one terminal of a capacitor cc for cutting the direct current components and a capacitor cd constituting a load capacitance on a side of the output terminal out is connected between the one terminal of the capacitor cc and a power source terminal VDD. Further, other terminal of the capacitor cc is connected with a terminal vout for externally attaching an anode of a varicap diode cv. Further, there is provided a terminal xout for externally connecting a cathode of the varicap diode cv and other terminal of the crystal resonator x1. The terminal xout is connected with a control terminal ct1 for applying control voltage to the varicap diode cv via a resistor rb1 and the terminal vout is connected with the anode of the varicap diode cv and a power source terminal VSS (0 v) via a resistor rb2. By externally connecting the crystal resonator x1 between the terminal xin and the terminal xout and externally connecting the varicap diode cv between the terminal vout and the terminal xout, a voltage controlled oscillator is constituted by connecting a series circuit of the crystal resonator x1 and the varicap diode cv between the input terminal in and the output terminal out of the CMOS inverter iv1 functioning as an oscillation amplifying portion, in other words, to the power source terminals VDD via the load capacitances. A capacitance value of the varicap diode cv is changed by the control voltage applied from a control circuit, not illustrated, to the terminal ct1 to thereby control oscillation frequency.

Figure 8:
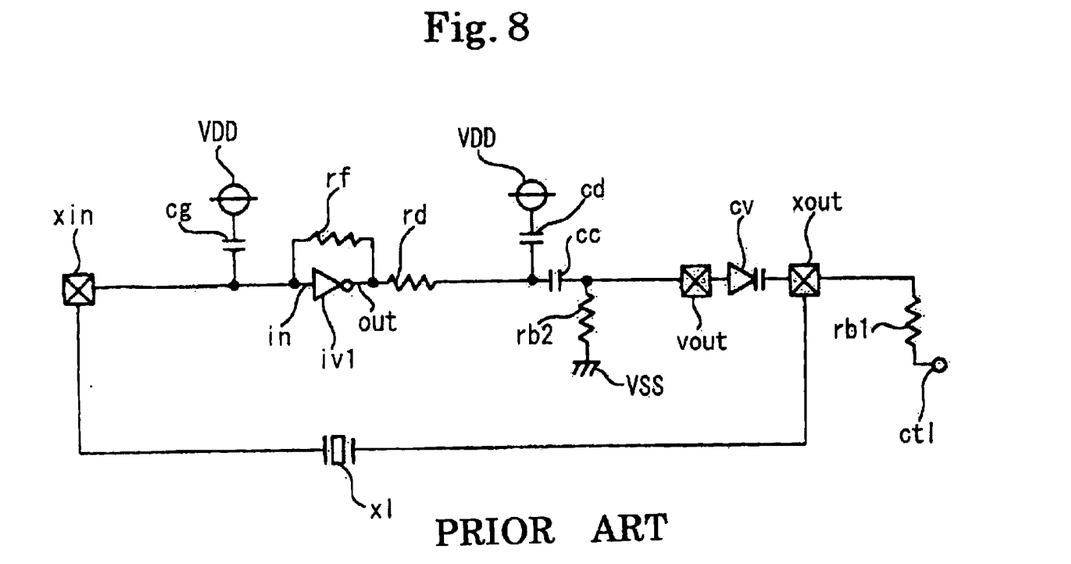
FIG. 8 is an electric circuit diagram showing a constitution of a conventional voltage controlled oscillator.
Figure 9:
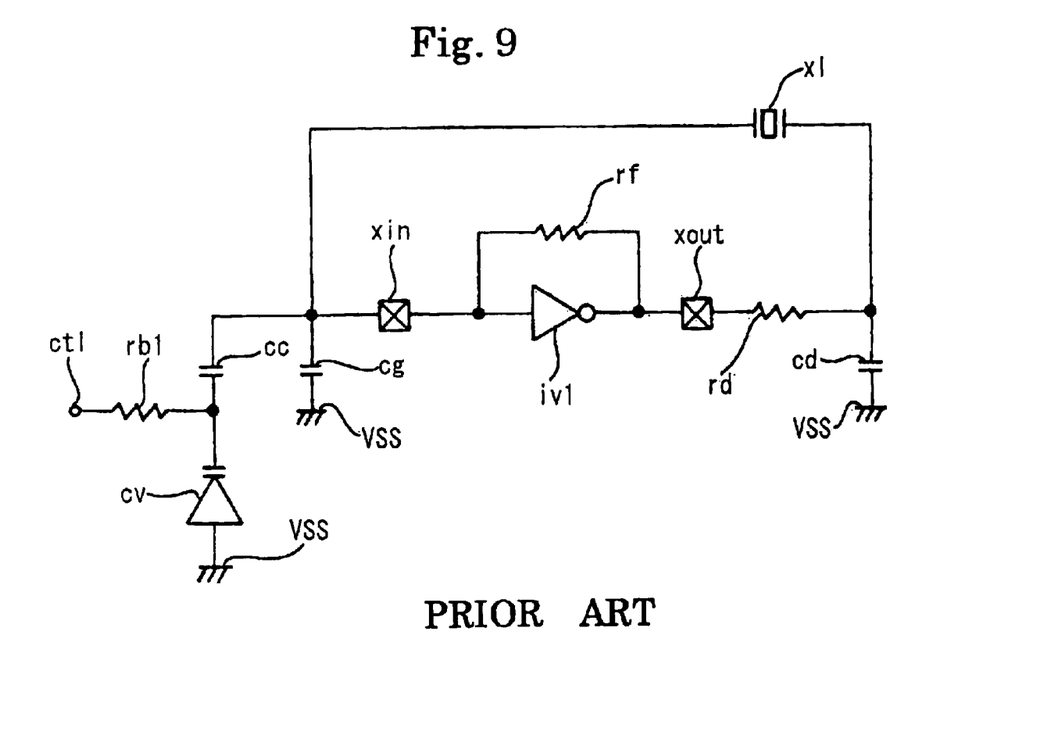
FIG. 9 is an electric circuit diagram showing a constitution of a conventional voltage controlled oscillator.

An explanation will be given of a constitution shown in FIG. 9. In FIG. 9, respective constituent elements in correspondence with respective constituent elements of FIG. 8 are designated by the same notations. The respective constituent elements other than the feedback resistor rf and the CMOS inverter iv1 are externally attached. The input terminal in and the output terminal out of the CMOS inverter iv1 are respectively connected with the terminals xin and xout for external attachment, the terminal xin and the terminal xout are externally attached respectively with the capacitors cg and cd and the crystal resonator x1 is externally attached between the terminal xin and the terminal xout. Further, the capacitor cc for cutting direct current components and the varicap diode cv are connected in series between the terminal xin and the power source terminals VSS (in FIG. 9, constituting external power source terminals set to, for example, 0V) and a connection point of the capacitor cc and the varicap diode cv is connected with the control terminal ct1 via the resistor rb1. Also according to the constitution of FIG. 9, the capacitance value of the varicap diode cv is changed by control voltage applied from a control circuit, not illustrated, to the terminal ct1 to thereby control the oscillation frequency.

According to the voltage controlled oscillators, described above, it is generally requested to operate the crystal resonator x1 by a low amplitude in order to enlarge a variable width of the oscillation frequency. Therefore, for example, there is a constitution of restricting supply current to the oscillation amplifying portion, that is, the CMOS inverter iv1 and according to such a constitution, conductance gm of the oscillation amplifying portion is lowered. Further, in order to maintain oscillation starting performance, it is necessary to maintain a negative resistance −RL at a large value to some degree. When the oscillation frequency is designated by notation ω and the load capacitances are designated by notations Cg and Cd, the negative resistance −RL is represented by −RL≈−gm/(ω²Cd·Cg) and in order to maintain the negative resistance while reducing the conductance gm, it is necessary to reduce the load capacitances Cg and Cd. However, reduction in the load capacitances Cg and Cd amounts to reduction in the variable width of the oscillation frequency. Therefore, ensuring the oscillation starting performance and enlarging the variable width of the oscillation frequency are not compatible with each other.

SUMMARY OF THE INVENTION

Hence, it is an object of the invention to provide a voltage controlled oscillator having a large variable width of an oscillation frequency while ensuring oscillation starting performance.

According to the invention, there is provided a voltage controlled oscillator comprising an inverter connected with a piezoelectric resonator between an input terminal and an output terminal thereof, a varicap diode in which a cathode thereof is connected with a control terminal and an anode thereof or the cathode is connected to the output terminal or the input terminal via a cutting capacitance element for cutting a direct current component, and a switching element for selectively connecting a capacitance element other than the cutting capacitance element in series with a series circuit constituted by the piezoelectric resonator and the varicap diode, wherein the switching element is made OFF when oscillating operation is brought into an initial state.

Further, according to the voltage controlled oscillator of the invention, it is preferable that pluralities of the capacitance elements and the switching elements are provided and the plurality of the capacitance elements are selectively connected by the plurality of the switching elements.

Further, according to the voltage controlled oscillator of the invention, it is preferable that the switching element is an MOS transistor and an on resistance of the MOS transistor is controlled by a control voltage applied to a gate thereof.

Further, it is preferable that the voltage controlled oscillator of the invention is provided with a detecting circuit for generating a detection output by detecting that an oscillation signal of the inverter is provided with a predetermined amplitude value, wherein the switching element is made on in response to generating the detection output.

DETAILED DESCRIPTION OF THE PREFERRED EMBODIMENTS

Figure 1:
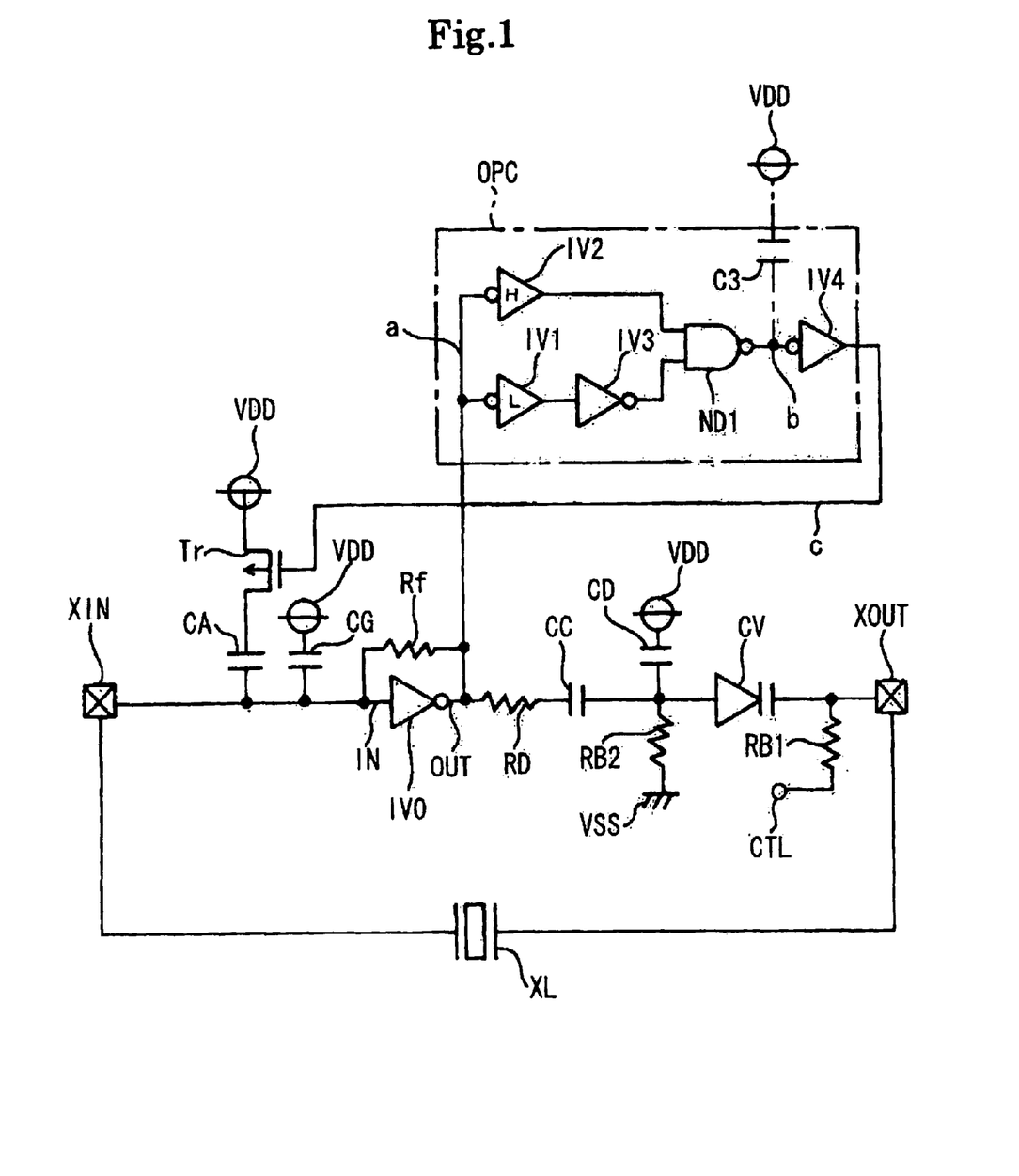
FIG. 1 is an electric circuit diagram showing a constitution of a voltage controlled oscillator according to a first embodiment of the invention.

A detailed explanation will be given of embodiments of the invention based on examples in reference to the attached drawings as follows. FIG. 1 is an electric circuit diagram for explaining a constitution of a voltage controlled oscillator according to the first embodiment of the invention and an explanation will firstly be given of a circuit constitution of the example. A feedback resistor Rf is connected between an input terminal IN and an output terminal OUT of a CMOS inverter IV0 constituting an inverter constituting an oscillation amplifying portion. A capacitor CG constituting a load capacitance is connected between the input terminal IN of the CMOS inverter IV0 and a power source terminal VDD (for example, 3V). A connection point of the input terminal IN and the capacitor CG is connected with a terminal XIN for externally attaching one terminal of a crystal resonator XL constituting a piezoelectric resonator. Further, as the piezoelectric resonator, other than the crystal resonator, a surface acoustic wave resonator or the like may be used. A connection point of the output terminal OUT of the CMOS inverter IV0 and the resistor Rf is connected with one terminal of a resistor RD. The resistor RD is provided for restraining crystal current flowing at the crystal resonator and controlling the crystal current to an optimum value. Thereby, a frequency control width can be enlarged while maintaining an oscillation condition. Further, the same can be applied to other piezoelectric resonator. Other terminal of the resistor RD is connected with one terminal of a capacitor CC for cutting direct current components. A capacitor CD constituting a load capacitance on a side of the output terminal OUT is connected between other terminal of the capacitor CC and a power source terminal VDD. Further, the other terminal of the capacitor CC is connected with an anode of a varicap diode CV. A cathode of the varicap diode CV is connected with a voltage control terminal CTL for applying control voltage to the varicap diode CV via a resistor RB1. The anode of the varicap diode CV is connected to a power source terminal VSS via a resistor RB2. Further, the cathode of the varicap diode CV is provided with a terminal XOUT for externally connecting other terminal of the crystal resonator XL. Further, the capacitor CC is for separating from the output terminal of the CMOS inverter IV0 in view of direct current. Thereby, the output terminal of the CMOS inverter IV0 is not fixed via the resistor RB2.

Further, a series circuit of a capacitor CA and a P-channel MOS transistor Tr is connected between the input terminal IN of the CMOS inverter IV0 and a power source terminal VDD. By applying a control signal of two values of "L" or "H" from an detecting circuit OPC, mentioned later, to the gate of the P-channel MOS transistor Tr, an ON/OFF state of the P-channel MOS transistor Tr is controlled and the capacitor CA is selectively connected between the input terminal IN of the CMOS inverter IV0 and the power source terminal VDD.

Figure 2A:
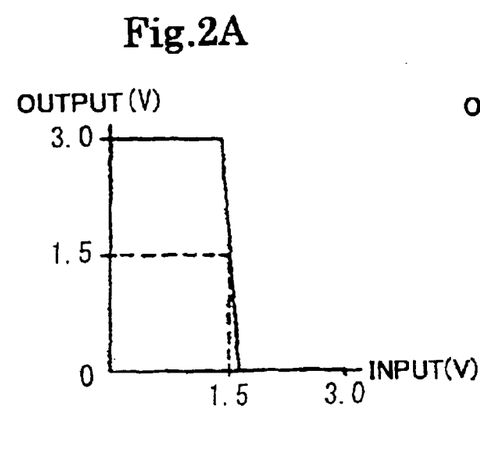
FIGS. 2A, 2B, 2C and 2D are characteristic diagrams showing output voltage-input voltage characteristics of respective CMOS inverters of FIG. 1.
Figure 2B:
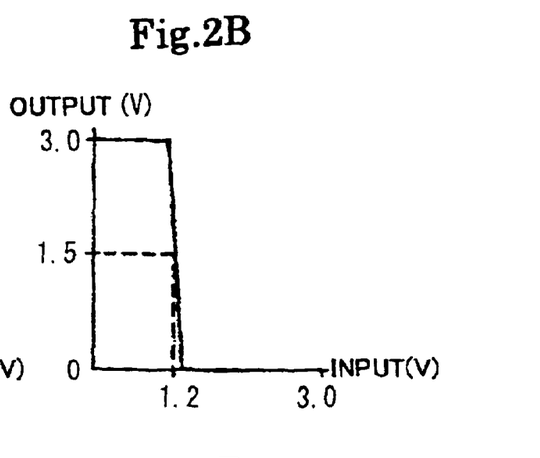
Figures 2C, 2D:
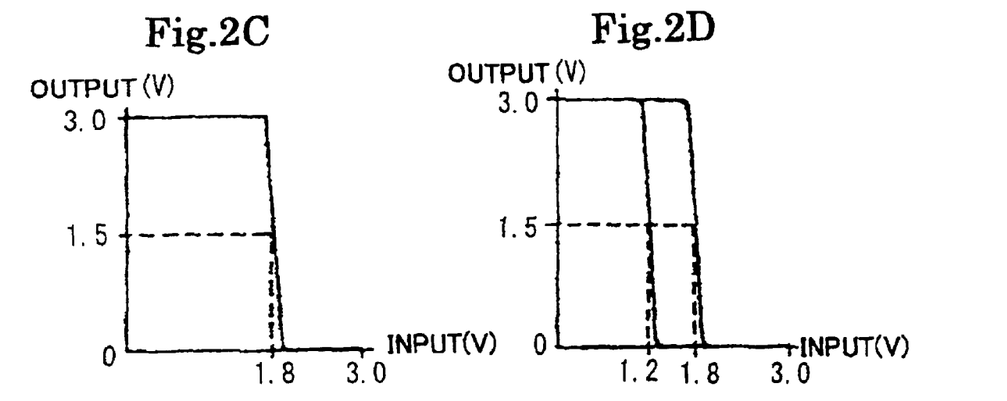

The detecting circuit OPC is constituted by CMOS inverters IV1, IV2, IV3 and IV4, a CMOS nand gate ND1, and a capacitor C3. The CMOS inverter IVY is provided with an input/output characteristic as shown by FIG. 2B and inverting potential thereof is 1.2V according to the embodiment. In the following, in such a CMOS inverter, an inverter sign is attached with "L". The CMOS inverter IV2 is provided with an input/output characteristic as shown by FIG. 2C and inverting potential thereof is 1.8V according to the embodiment. In the following, in such a CMOS inverter, an inverter sign is attached with "H". Further, an inverter in which an inverter sign is not attached with "L" or "H", is provided with an input/output characteristic as shown by FIG. 2A similar to the CMOS inverter IV0 so far as not particularly specified otherwise and inverting potential thereof is 1.5V according to the embodiment. The input terminal of the CMOS inverter IV1 and an input terminal of the CMOS inverter IV2 are connected by a terminal a, which is connected to the output terminal OUT of the CMOS inverter IV0. An output terminal of the CMOS inverter IV1 is connected to one input terminal of the CMOS nand gate ND1 via the CMOS inverter IV3. An output terminal of the CMOS inverter IV2 is connected to other input terminal of the CMOS nand gate ND1. A terminal b constituting a connection point of an output terminal of the CMOS nand gate ND1 and an input terminal of the CMOS inverter IV4, is connected to a power source terminal VDD (in this case, set to 3V) via the capacitor C3. By such a constitution, during a time period in which potential of an oscillation signal from the output terminal OUT of the CMOS inverter IV0 becomes equal to or lower than 1.2V or equal to or higher than 1.8V, the capacitor C3 is discharged, potential of the terminal b is gradually elevated, when the potential of the terminal b exceeds inverting potential of 1.5V of the CMOS inverter IV4, an output terminal c of the detecting circuit OPC becomes "L", which is defined as a detection output indicating that the oscillation signal is provided with a predetermined amplitude value and the voltage controlled oscillator is brought into oscillating operation having a steady-state amplitude. The terminal C is connected to the gate of the P-channel MOS transistor Tr for making the gate ON.

The above-described respective constituent elements are integrated to a single chip except the crystal resonator XL. By externally connecting the crystal resonator XL between the terminal XIN and the terminal XOUT, a series circuit of the crystal resonator XL and the varicap diode CV is connected between the input terminal IN and the output terminal OUT of the CMOS inverter IV0 constituting the oscillation amplifying portion, in other words, to the power source terminals VDD via the load capacitances to thereby constitute the voltage controlled oscillator. A capacitance value of the varicap diode CV is made variable by control voltage in a reverse direction applied from a control circuit, not illustrated, to the voltage control terminal CTL to thereby control the oscillation frequency.

Figure 3:
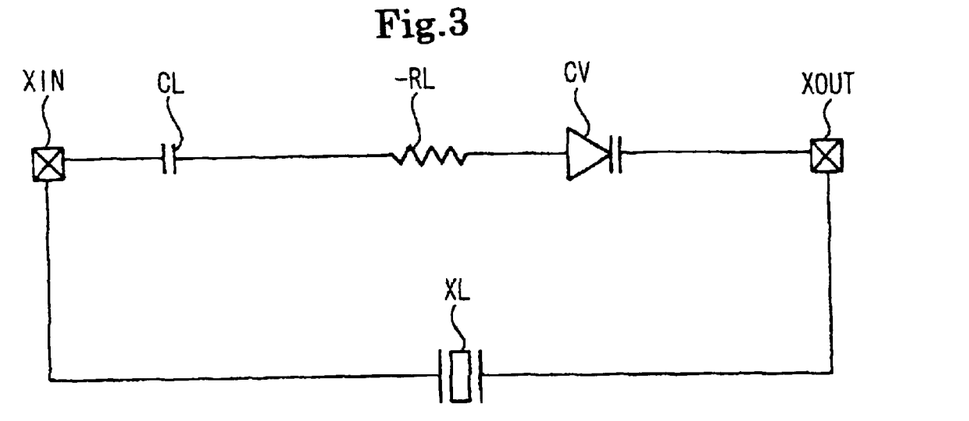
FIG. 3 is an equivalent circuit diagram for explaining operation of the voltage controlled oscillator of FIG. 1.

Next, an explanation will be given of operation of the example. First, an explanation will be given of an outline of operation of the voltage controlled oscillator according to the example in reference to an equivalent circuit shown in FIG. 3. According to the voltage controlled oscillator of the example, there is formed a series circuit by the crystal resonator XL, the varicap diode CV, a capacitor CL and a negative resistance −RL. The capacitor CL indicates a composite capacitance of capacitors connected in series with the crystal resonator XL and the varicap diode CV, the composite capacitance is a composite capacitance including the capacitors CG and CD when the P-channel MOS transistor Tr is made OFF and is a composite capacitance including the capacitors CG, CD and CA when the P-channel MOS transistor Tr is made ON. Further, the oscillation frequency of the crystal resonator XL is determined by a capacitor CL' constituting a composite capacitance including the varicap diode CV and when a capacitance value thereof is designated by notation CL' and capacitance values of the varicap diode CV and the capacitor CL are respectively designated by notations CV and CL, the capacitance value CL' can be represented by CL'=CL·CV/(CL+CV). As is apparent therefrom, the larger the value of the capacitor CL than the capacitance value of the varicap diode CV, the more effectively a change in the capacitance of the varicap diode CV can be reflected to the capacitor CL'. Therefore, by selectively connecting the capacitor CA as described above, the capacitance value of the capacitor CL can be increased and the effect by the change in the capacitance of the varicap diode CV as compared with the capacitance of the capacitor CL' can be enhanced.

Figure 4A:
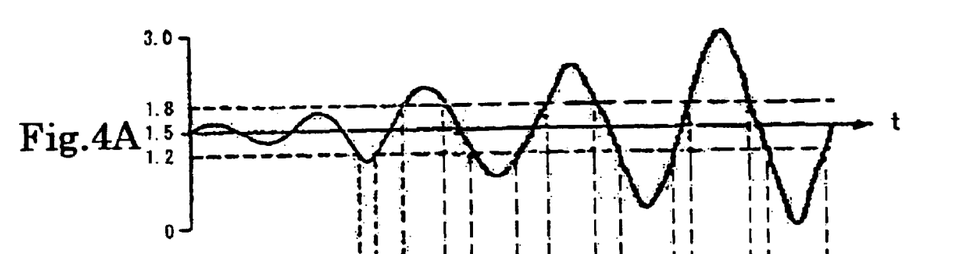
FIGS. 4A, 4B and 4C are voltage waveform diagrams for explaining operation of the voltage controlled oscillator of FIG. 1.

Next, an explanation will be given of oscillating operation of the voltage controlled oscillator according to the example in reference to FIGS. 4A, 4B and 4C. FIG. 4A shows a voltage waveform of the terminal a connected to the output terminal OUT of the CMOS inverter IV0, FIG. 4B shows a voltage waveform of the terminal b of the detecting circuit OPC and FIG. 4C shows a voltage waveform of the output terminal c of the detecting circuit OPC.

As shown by FIG. 4A, in an initial state of the oscillating operation of the voltage controlled oscillator, potential of an oscillation signal from the CMOS inverter IV0 is disposed between the inverting potential (1.2V) of the CMOS inverter IV1 and the inverting potential (1.8V) of the CMOS inverter IV2 and a logical output value of the CMOS inverter IV1 is "L" and a logical output value of the CMOS inverter IV2 is "H". Further, a logical output value of the CMOS nand gate ND1 becomes "L" and the capacitor C3 is brought into a charged state. Thereby, a logical output value of the CMOS inverter IV4 becomes "H", that is, the output terminal c is brought into "H". By "H" of the terminal c of the detecting circuit OPC, the P-channel MOS transistor Tr is made OFF, the capacitor CA is not connected between the input terminal IN of the CMOS inverter IV0 and the power source terminal VDD and the value of the capacitor CL is made small. By that amount, the negative resistance −RL can be made large and the oscillation starting performance is maintained to be excellent.

Figure 4B:
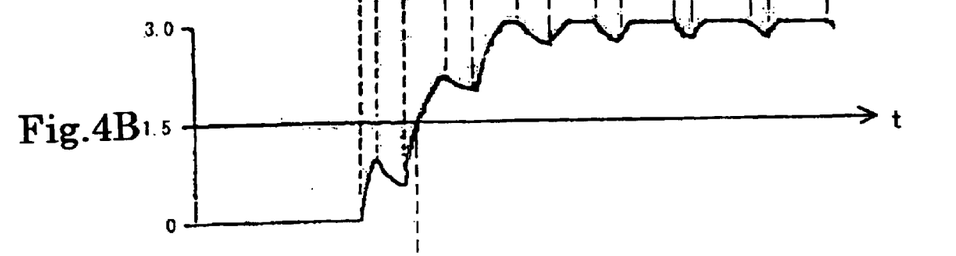

As shown by FIG. 4B, when the oscillating potential of the oscillation signal becomes lower than the inverting potential (1.2V) of the CMOS inverter IV1 or becomes higher than the inverting potential (1.8V) of the CMOS inverter IV2, the logical output value of the CMOS nand gate ND1 becomes "H", at this occasion, by pertinently selecting a value of the capacitor C3 and a value of ON resistance of an MOS transistor constituting the CMOS nand gate ND1, the capacitor C3 is discharged, charge voltage between both ends of the capacitor C3 is lowered and the potential of the terminal b of the capacitor C3 is elevated.

Figure 4C:
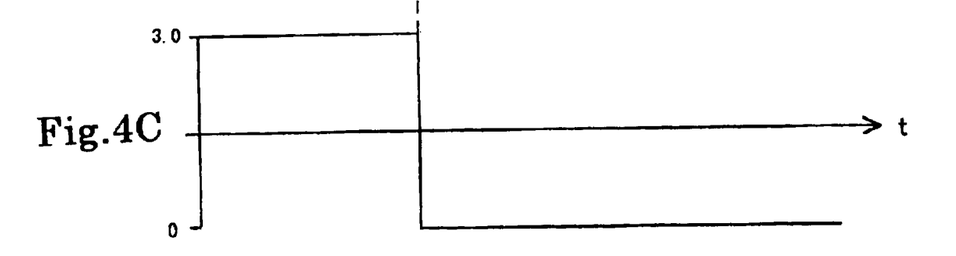

In accordance with an increase in the amplitude value of the oscillation signal, elevation of the potential of the terminal b of the capacitor C3 is repeated and when input potential of the CMOS inverter IV4 becomes higher than first inverting potential (1.5V), as shown by FIG. 4(C), the logical output value of the CMOS inverter IV4 is inverted from "H" to "L". Thereby, the P-channel MOS transistor Tr is made ON and the capacitor CA is connected between the input terminal IN of the CMOS inverter IV0 and the power source terminal VDD. Thereby, in the series circuit including the crystal resonator XL and the varicap diode CV by way of the power source terminal VDD, the capacitance value of the capacitor CL connected in series with the varicap diode CV, is increased, the effect by the change in the capacitance of the varicap diode CV appearing at the capacitor CL' can be increased and the width of changing the oscillation frequency can be enlarged.

As described above, according to the example, in the initial state of oscillating operation of the voltage controlled oscillator, by reducing the load capacitance by making the P-channel MOS transistor Tr OFF, the negative resistance −RL can be increased by that amount and the crystal resonator can be operated by a low amplitude by reducing the conductance gm of the oscillation amplifying portion by that amount and the width of changing the oscillation frequency can be increased while ensuring the oscillation starting performance.

Figure 5:
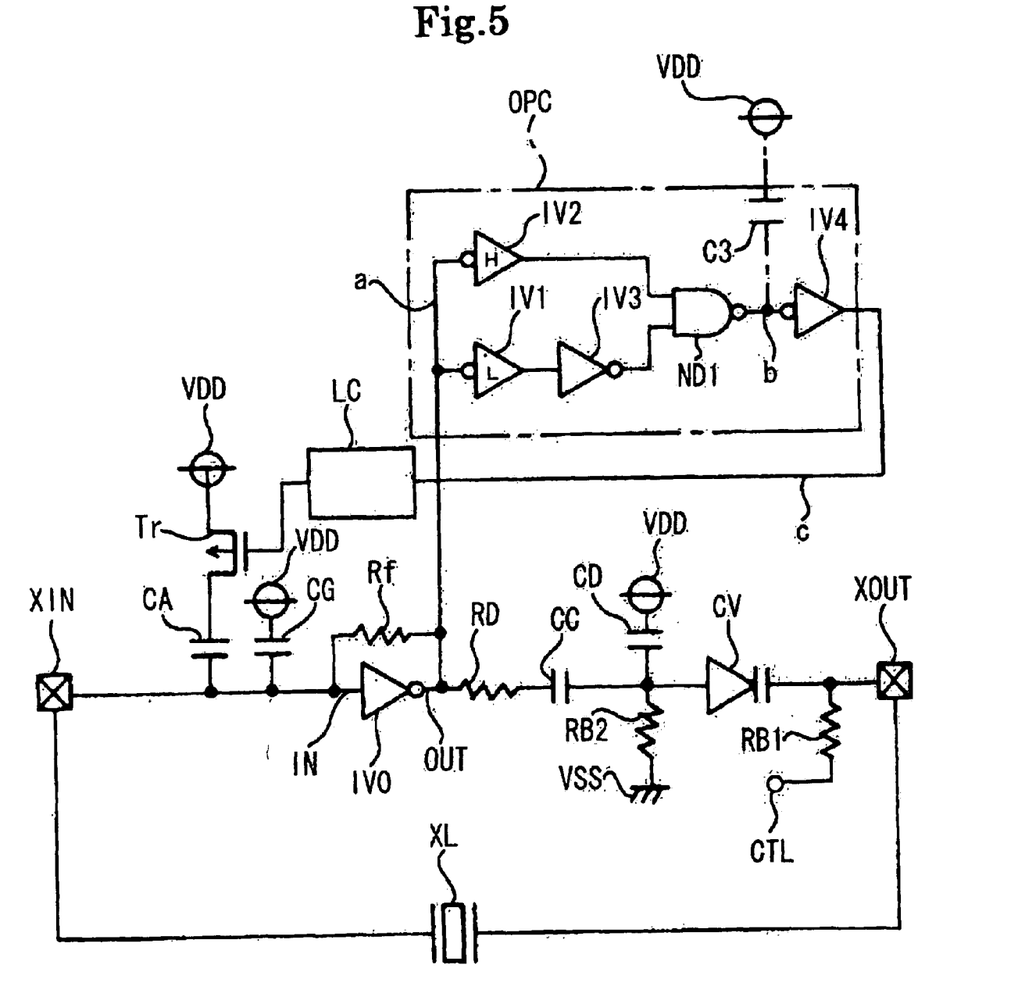
FIG. 5 is an electric circuit diagram showing a constitution of a voltage controlled oscillator according to a second embodiment of the invention.

Next, an explanation will be given of a voltage controlled oscillator according to a second embodiment of the invention. Although according to the above-described first embodiment, a description has been given such that the gate of the P-channel MOS transistor Tr is applied with the control signal of two values of logical levels to make the gate simply ON and OFF, the invention is not limited thereto. For example, a constitution may be constructed as shown by FIG. 5. In FIG. 5, notations the same as those in FIG. 1 designate constituent elements the same as those of FIG. 1, which is similar to respective drawing, described below. According to the example, a level control circuit LC is inserted at a postage of the detection output of the detecting circuit OPC, after the output of the terminal c becomes "L", there is generated a control signal having multiple values of logical levels designated by a control circuit, not illustrated, and the control signal is given to the gate of the P-channel MOS transistor Tr to thereby control the ON resistance of the P-channel MOS transistor Tr and control the effect of the capacitor CA as compared with the capacitor CL. By constructing the constitution in this way, not only operation and effect similar to those of the above-described first embodiment are achieved but also finer oscillation frequency control can be carried out synergetically with a control of the capacitance value of the varicap diode CV by the control voltage applied to the voltage control terminal CTL.

Figure 6:
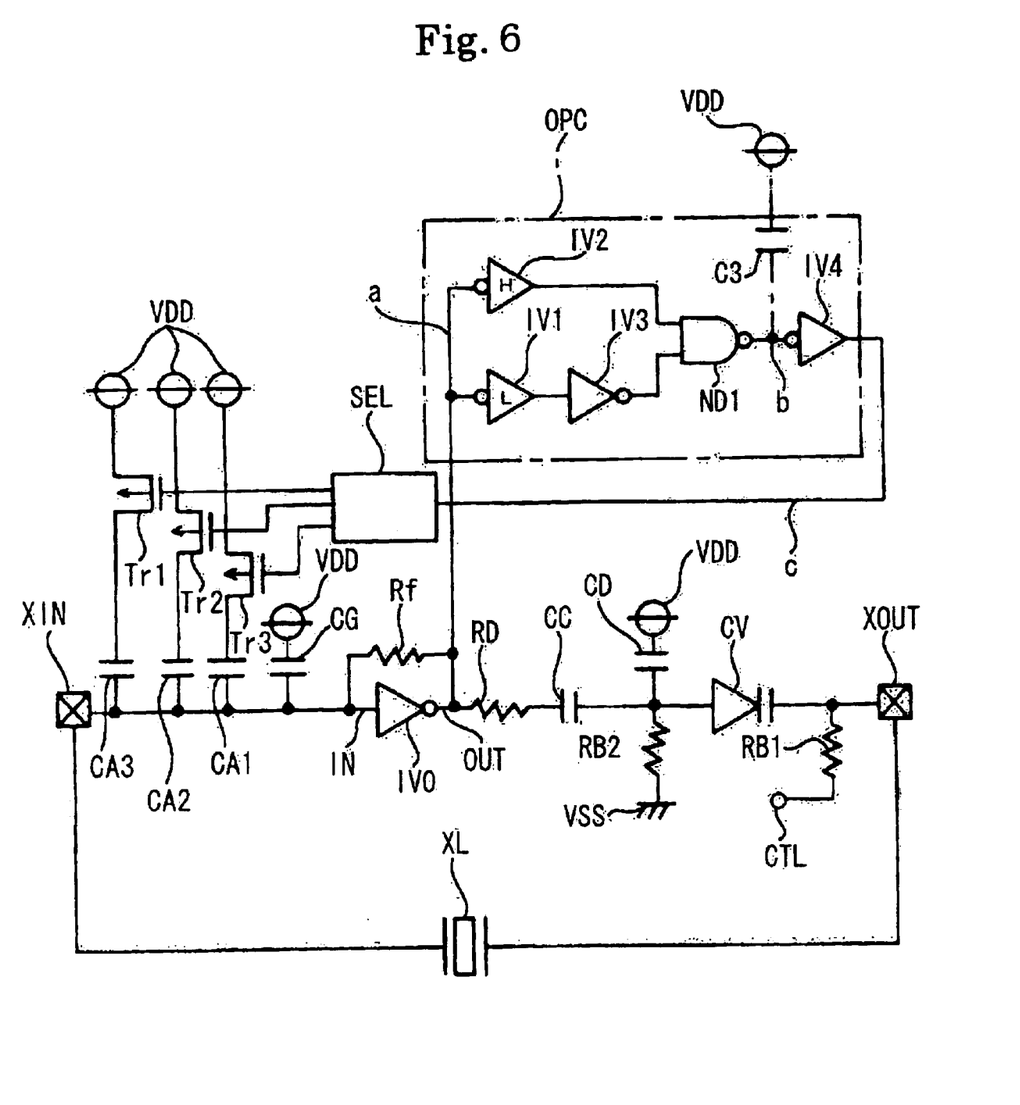
FIG. 6 is an electric circuit diagram showing a constitution of a voltage controlled oscillator according to a third embodiment of the invention.

Next, an explanation will be given of a voltage controlled oscillator according to a third embodiment of the invention. Although according to the above-described first embodiment, a single one of the series circuit of the P-channel MOS transistor Tr and the capacitor CA is connected between the input terminal IN of the CMOS inverter IV0 and the power source terminal VDD, the invention is not limited thereto. For example, as shown by FIG. 6, a plurality of the series circuits may be connected between the input terminal IN of the CMOS inverter IV0 and the power source terminal VDD. According thereto, there may be constructed a constitution in which P-channel MOS transistors Tr1 through Tr3 and capacitors CA1 through CA3 are connected respectively in series between the input terminal IN of the CMOS inverter IV0 and the power source terminal VDD and the control signal is given from a selecting circuit SEL to the gates of the P-channel MOS transistors Tr1 through Tr3 to thereby control ON and OFF thereof. The selecting circuit SEL is connected to the terminal c of the detecting circuit OPC and receives the detection output, all of the P-channel MOS transistors Tr1 through Tr3 are made OFF until the output of the terminal c becomes "L" and after the output of the terminal c becomes "L", the P-channel MOS transistors Tr1 through Tr3 are selectively made ON in accordance with a control signal from a control circuit, not illustrated. Thereby, the capacitor CL is determined by a composite capacitance by at least any one of the capacitors CA1 through CA3 or combinations of these. According thereto, not only operation and effect similar to those of the above-described first embodiment are achieved but also finer oscillation frequency control can be carried out synergetically with the control of the capacitance value of the varicap diode CV by the control voltage applied to the voltage control terminal CTL.

Figure 7:
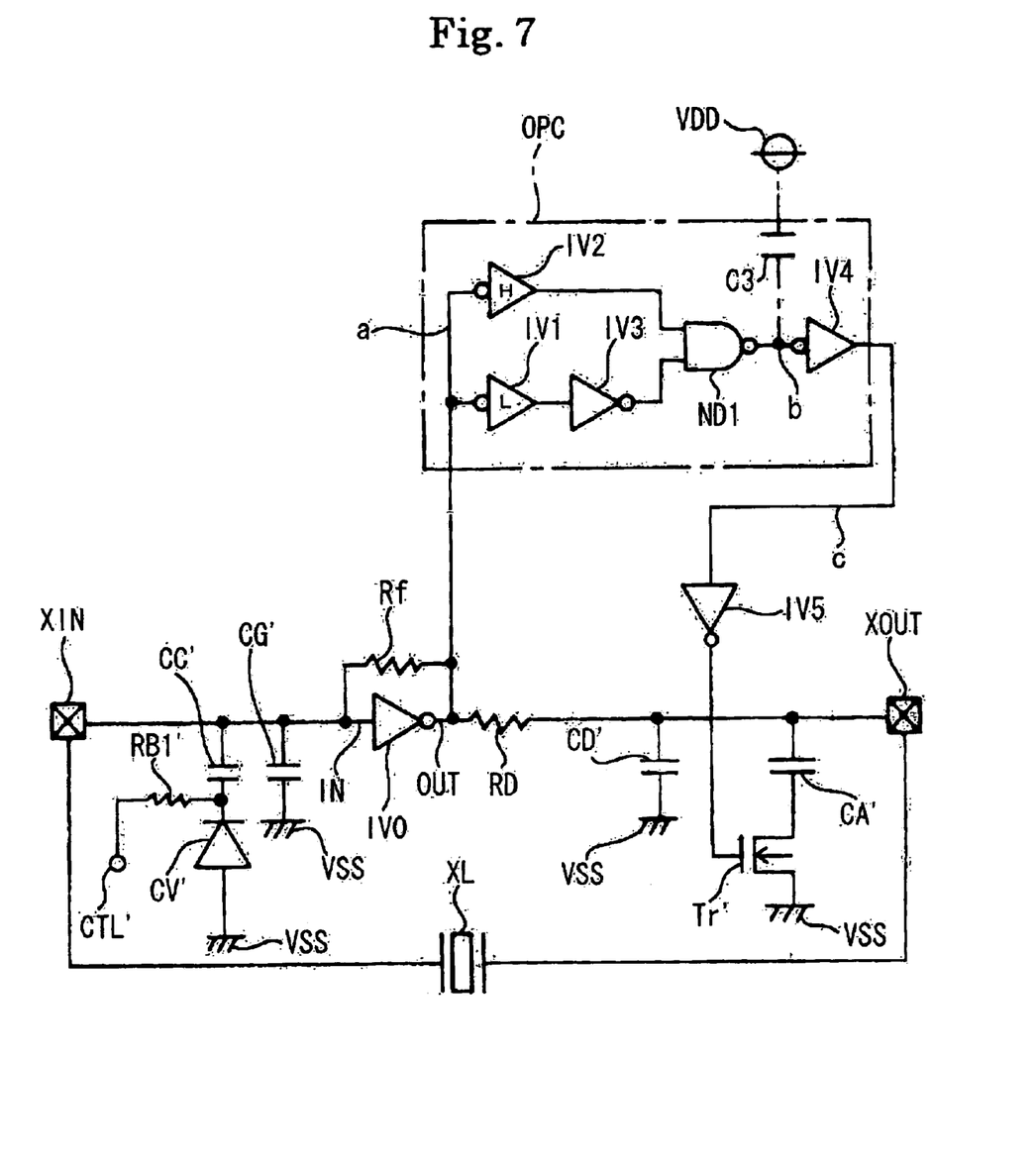
FIG. 7 is an electric circuit diagram showing a constitution of a voltage controlled oscillator according to a fourth embodiment of the invention.

Next, an explanation will be given of a voltage controlled oscillator according to a fourth embodiment of the invention. Although according to the above-described first embodiment, the anode of the varicap diode CV is connected to the side of the output terminal OUT of the CMOS inverter IV0 and the capacitor CA is connected to the side of the input terminal of the CMOS inverter IV0, the invention is not limited thereto. Further, although according to the above-described first embodiment, the capacitors CG and CD constituting the load capacitances are connected to the power source terminals VDD on a high potential side, the invention is not limited thereto. For example, there may be constructed a constitution as shown by FIG. 7. An anode of a varicap diode CV' is connected to a power source terminal VSS on a low potential side and a cathode thereof is connected to the input terminal IN of the CMOS inverter IV0 via a capacitor CC' for cutting direct current components and a connection point of the cathode and the capacitor CC' is connected with a control terminal CTL' via a resistor RB1'. A capacitor CG' constituting a load capacitance is connected between the input terminal IN of the CMOS inverter IV0 and a power source terminal VSS and a capacitor CD' constituting a load capacitance is connected between the output terminal OUT of the CMOS inverter IV0 and a power source terminal VSS. The capacitor CD' is connected to the output terminal OUT of the CMOS inverter IV0 via the resistor RD. Further, an N-channel MOS transistor Tr' and a capacitor CA' are connected in series between the output terminal OUT of the CMOS inverter IV0 and a power source terminal VSS. The capacitor CA' is connected to the output terminal OUT of the CMOS inverter IV0 via the resistor RD. The gate of the N-channel MOS transistor Tr' is connected to the terminal C via a CMOS inverter IV5.

Also in the example constituted as described above, in view of an equivalent circuit, by making the N-channel MOS transistor Tr' ON, the capacitor CA' is connected in series with the series circuit including the varicap diode and the crystal resonator XL. Therefore, operation and effect similar to those of the above-described first embodiment are achieved.

As described above, according to the invention, there may be constructed the constitution in which the capacitor is selectively connected in series with the series circuit including the varicap diode and the crystal resonator in view of the equivalent circuit, for example, according to the above-described constitution of the first embodiment, the P-channel MOS transistor Tr and the capacitor CA may be connected in series between the output terminal OUT of the CMOS inverter IV0 and the power source terminal VDD. That is, the series circuit constituted by the capacitor and the switching element may be connected to either side of the input terminal IN and the output terminal OUT of the CMOS inverter IV0 or a desired number of the series circuits may be connected to both of them. Further, the series circuit may be connected not to the side of the power source terminal VDD but to the side of the power source terminal VSS or a desired number of the series circuits may be connected to both of them.

Further, although according to the above-described respective embodiments, the MOS transistor is used as the switching element for selectively connecting the capacitor to the series circuit including the varicap diode and the crystal resonator, the invention is not limited thereto. As the switching elements, a transmission gate may be used and various constitutions can be used.

Further, although according to the above-described respective embodiments, the detecting circuit OPC is used, the invention is not limited thereto but various constitutions of detecting circuits can be utilized. For example, a Schmitt inverter may be used in place of the CMOS inverter IV4 in the detecting circuit OPC, thereby, even in the case in which during a transition period of the voltage controlled oscillator from oscillation initial operation to steady-state amplitude operation, the potential of the terminal b stays at a vicinity of specific potential for a long period of time, a variation in the potential of the terminal b is absorbed by a hysteresis characteristic of the Schmitt inverter as shown by FIG. 2D, thereby, a variation in the detecting circuit OPC can be restrained and ON/OFF states of the switching element can be stabilized.

Further, other than using the detecting circuit OPC for actually monitoring the oscillation signal from the CMOS inverter IV0 as in the above-described respective embodiments, there may be constructed a constitution in which a power on resetting circuit or the like is provided, the oscillating operation is regarded to shift from the initial state to the steady-state by elapse of a predetermined period of time from supply of power to the voltage controlled oscillator and the switching element is made ON by an out put of the power on resetting circuit which falls after elapse of the predetermined period of time from supplying power to the voltage controlled oscillator, or the switching element may be made OFF during a time period in which the oscillating operation is regarded to be brought into the initial state by an external circuit for controlling the voltage controlled oscillator. According to the invention, there may be constructed a constitution in which the switching element is made OFF during a time period in which the oscillating operation is regarded to be brought into the initial state.

According to the invention, in the initial state of the oscillating operation, the capacitance element is separated from the series circuit constituted by the piezoelectric resonator and the varicap diode by the switching element. Therefore, in the initial state of the oscillating operation, the load capacitance can be reduced, the conductance gm of the inverter constituting the oscillation amplifying portion can be reduced by the amount of capable of reducing the load capacitance while maintaining the negative resistance which is needed to the degree of providing the excellent oscillation starting performance and the piezoelectric resonator of the crystal resonator or the like can be operated by the low amplitude.

After the oscillating operation is shifted from the initial state to the steady state, for example, by the detecting circuit, it is detected that the oscillation signal of the inverter is provided with the predetermined amplitude value, which is generated as the detection output indicating that the oscillating operation is shifted from the initial state to the steady state, the switching element is made ON in response to generating the detection output, thereby, the capacitance element is connected in series with the series circuit constituted by the piezoelectric resonator and the varicap diode, thereby, the effect provided to the composite capacitance connected to the piezoelectric oscillator by the change in the capacitance of the varicap diode, can be enhanced. Therefore, the width of changing the oscillation frequency can be enlarged. By the above-described, there can be provided the voltage controlled oscillator having the large variable width of the oscillation frequency while ensuring the oscillation starting performance.

What is claimed is:

1. A voltage controlled oscillator comprising:
   an inverter connected with a piezoelectric resonator between an input terminal and an output terminal thereof;
   a varicap diode in which a cathode thereof is connected with a control terminal and an anode thereof or the cathode is connected to the output terminal or the input terminal via a cutting capacitance element for cutting a direct current component; and
   a switching element for selectively connecting a capacitance element other than the cutting capacitance element in series with a series circuit constituted by the piezoelectric resonator and the varicap diode;
   a control circuit that controls the switching element such that the switching element is temporarily set to an OFF state when oscillating operation of the voltage controlled oscillator is initiated and subsequently set to an ON state after oscillating operation is established.

2. The voltage controlled oscillator according to claim 1:
   wherein the capacitance element is a plurality of the capacitance elements and the switching element is a plurality of switching elements and the plurality of the capacitance elements are selectively connected by the plurality of the switching elements.

3. The voltage controlled oscillator according to claim 1 or 2:
   wherein the switching element is an MOS transistor and an on resistance of the MOS transistor is controlled by a control voltage applied to a gate thereof.

4. A voltage controlled oscillator comprising:
   an inverter connected with a piezoelectric resonator between an input terminal and an output terminal thereof;
   a varicap diode in which a cathode thereof is connected with a control terminal and an anode thereof or the cathode is connected to the output terminal or the input terminal via a cutting capacitance element for cutting a direct current component;
   a switching element for selectively connecting a capacitance element other than the cutting capacitance element in series with a series circuit constituted by the piezoelectric resonator and the varicap diode;
   a detecting circuit for generating a detection output by detecting that an oscillation signal of the inverter is provided with a predetermined amplitude value;
   wherein the switching element is controlled by the detection output and is set to an OFF state when oscillating operation is initiated, and the switching element is set to an ON state in response to generating the detection output.

5. The voltage controlled oscillator according to claim 4 wherein the capacitance element is a plurality of the capacitance elements and the switching element is a plurality of switching elements and the plurality of the capacitance elements are selectively connected by the plurality of the switching elements.

6. The voltage controlled oscillator according to claim 4 or 5 wherein the switching element is an MOS transistor and an on resistance of the MOS transistor is controlled by a control voltage applied to a gate thereof.

7. A voltage controlled oscillator comprising:
   an inverter having an inverter input connected to an input terminal and an inverter output connected to an output terminal;
   a piezoelectric resonator connected across the input terminal and the an output terminal;
   a varicap diode having a first terminal connected to one of said inverter input and said inverter output and a second terminal connected to a control terminal for controlling a frequency of oscillation;
   a capacitance element connected to one of said inverter input and said inverter output;
   a switching element for selectively connecting the capacitance element as a bypass capacitor controlling a range of frequency control and negative resistance; and
   a control circuit that controls the switching element such that the switching element is temporarily set to an OFF state when oscillating operation of the voltage controlled oscillator is initiated to increase the negative resistance of the voltage control oscillator, and is subsequently set to an ON state after oscillating operation is established to increase the range of frequency control.

8. The voltage controlled oscillator according to claim 7 wherein the capacitance element is a plurality of the capacitance elements and the switching element is a plurality of switching elements and the plurality of the capacitance elements are selectively connected by the plurality of the switching elements.

9. The voltage controlled oscillator according to claim 7 or 8 wherein the switching element is an MOS transistor and an on resistance of the MOS transistor is controlled by a control voltage applied to a gate thereof by the control circuit.

10. The voltage controlled oscillator according to claim 7 or 8, wherein the control circuit is comprised of:
    a detecting circuit for generating a detection output by detecting that an oscillation signal of the inverter has a predetermined amplitude value; and
    the switching element is controlled by the detection output and is set to an OFF state when oscillating operation is initiated, and the switching element is set to an ON state in response the detection output being generated indicating that the oscillation signal of the inverter is at the predetermined amplitude value.

* * * * *